(12) United States Patent
Srinivasan et al.

(10) Patent No.: US 11,067,635 B2
(45) Date of Patent: Jul. 20, 2021

(54) BATTERY CELL EVALUATION SYSTEM

(71) Applicant: The Johns Hopkins University, Baltimore, MD (US)

(72) Inventors: Rengaswamy Srinivasan, Ellicott City, MD (US); Bliss G. Carkhuff, Laurel, MD (US)

(73) Assignee: The Johns Hopkins University, Baltimore, MD (US)

( * ) Notice: Subject to any disclaimer, the term of this patent is extended or adjusted under 35 U.S.C. 154(b) by 282 days.

(21) Appl. No.: 16/210,648

(22) Filed: Dec. 5, 2018

(65) Prior Publication Data

US 2019/0170829 A1 Jun. 6, 2019

Related U.S. Application Data

(60) Provisional application No. 62/599,842, filed on Dec. 18, 2017, provisional application No. 62/595,212, filed on Dec. 6, 2017.

(51) Int. Cl.
*G01R 31/389* (2019.01)
*G01R 31/396* (2019.01)
*G01R 31/36* (2020.01)

(52) U.S. Cl.
CPC ....... *G01R 31/389* (2019.01); *G01R 31/3648* (2013.01); *G01R 31/396* (2019.01)

(58) Field of Classification Search
CPC .. G01R 31/389; G01R 31/392; G01R 31/385; G01R 31/367; G01R 27/02; G01R 31/371; H02J 7/0021; H02J 7/0091; H02J 7/007; H01M 10/482; H01M 10/486; H01M 10/48; H01M 10/46; H01M 10/443; H01M 10/44; H01M 10/0525; Y02E 60/10

See application file for complete search history.

(56) References Cited

U.S. PATENT DOCUMENTS

2012/0155507 A1* 6/2012 Srinivasan .......... H01M 10/486
374/45

OTHER PUBLICATIONS

Srinivasan et al., The five modes of heat generation in a Li-ion cell under discharge, Journal of Power Sources 262 (2014) 93-103 (Year: 2014).*

(Continued)

*Primary Examiner* — Daniel R Miller
(74) *Attorney, Agent, or Firm* — Sung T. Kim

(57) ABSTRACT

An example battery cell diagnostic apparatus is provided that may include control circuitry, a current source, measurement circuitry, and a first and a second multiplexer. The control circuitry may be configured to control the first multiplexer to electrically connect the measurement circuitry to a battery cell and control the second multiplexer to electrically connect the current source to the battery cell to apply a current, output from the current source, at each of a set of frequencies to the battery cell. The control circuitry may also be configured to receive measurements from the measurement circuitry at each of the frequencies, which may include respective frequencies that correlate to an electrolytic resistance of the battery cell, an anode impedance of the battery cell, and a cathode impedance of the battery cell. Similar measurements may also be taken for each cell in a battery.

20 Claims, 3 Drawing Sheets

(56) References Cited

OTHER PUBLICATIONS

Srinivasan et al., Instantaneous measurement of the internal temperature in lithium-ion rechargeable cells, Electrochimica Acta 56 (2011) 6198-6204 (Year: 2011).*
A. Waligo and P. Barendse, "A comparison of the different broadband impedance measurement techniques for lithium-ion batteries," 2016 IEEE Energy Conversion Congress and Exposition (ECCE), Milwaukee, WI, 2016, pp. 1-7 (Year: 2016).*
Thanh-Tuan Nguyen, Van-Long Tran and Woojin Choi, "Development of the intelligent charger with battery State-of-Health estimation using online impedance spectroscopy," 2014 IEEE 23rd International Symposium on Industrial Electronics (ISIE), Istanbul, 2014, pp. 454-458 (Year: 2014).*

* cited by examiner

BATTERY CELL EVALUATION SYSTEM

CROSS-REFERENCE TO RELATED APPLICATIONS

This application claims the benefit of U.S. Provisional Application No. 62/595,212 filed on Dec. 6, 2017, and U.S. Provisional Application No. 62/599,842 filed on Dec. 18, 2017, the entire contents of which are hereby incorporated herein by reference.

TECHNICAL FIELD

Example embodiments generally relate to battery technology and, in particular, relate to the evaluation of battery cells.

BACKGROUND

Lithium-ion (Li-ion) and lithium-polymer (LiPO) batteries are popular rechargeable, lithium-based batteries for both civilian and military applications. While these batteries have proven to be highly effective for a variety of applications, these batteries still have drawbacks. One particularly problematic drawback is the likelihood of individual cells within a battery being or becoming mismatched. Mismatched cells are cells that do not possess matching electrolyte resistance, anode impedance, cathode impedance, state of charge (SoC), state of health (SoH), and whose entire anodes and entire cathodes (not just the negative and positive terminals) do not exhibit identical temperature when identical charging current and identical discharging current are passing through the battery cell. A battery with mismatched cells will diminish performance characteristics of the battery or even failures of the battery that can create safety concerns. In this regard, mismatched cells can, for example, generate substantial heat within a battery that can lead to melting and breakdown of internal barriers between and within the battery cells leading to a failure and, in some instances, a catastrophic failure.

While techniques have been developed to attempt to identify matched or mismatched cells within a battery, those techniques have proven ineffective because battery failures continue to occur. The most probable reason for the failure of those previously developed techniques is their inability to measure electrolyte resistance, anode impedance, cathode impedance, anode temperature and cathode temperature.

BRIEF SUMMARY OF SOME EXAMPLES

According to some example embodiments, a battery cell diagnostic apparatus is provided. The battery cell diagnostic apparatus may comprise control circuitry, a current source, measurement circuitry, a first multiplexer, and a second multiplexer. The measurement circuitry may be configured to measure electrical attributes of a battery cell within a plurality of battery cells and provide measurements of the electrical attributes to the control circuitry. The first multiplexer may be operably coupled to the measurement circuitry and the control circuitry. The first multiplexer may be configured to be removably coupled to each of the battery cells within the plurality of battery cells. The second multiplexer may be operably coupled to the current source and the control circuitry. Further, the second multiplexer may be configured to be removably coupled to each of the battery cells within the plurality of battery cells. The control circuitry may be configured to control the first multiplexer to electrically connect the measurement circuitry to the battery cell among the plurality of battery cells, and control the second multiplexer to electrically connect the current source to the battery cell to apply a current, output from the current source, at each of a set of frequencies to the first battery cell. The control circuitry may also be configured to receive the measurements from the measurement circuitry at each of the frequencies within the set of frequencies. In this regard, the set of frequencies may include a first frequency that correlates to an electrolytic resistance of the battery cell, a second frequency that correlates to an anode impedance of the battery cell, and a third frequency that correlates to a cathode impedance of the battery cell. The control circuitry may also be configured to store the measurements for the battery cell in a memory device.

According to some example embodiments, a system for assessing attributes of battery cells is provided. The system may comprise a plurality of battery cells and a battery cell diagnostic apparatus. Each battery cell may comprise terminals for connection. The battery cell diagnostic apparatus may comprise control circuitry, a current source, measurement circuitry, a first multiplexer, and a second multiplexer. The measurement circuitry may be configured to measure electrical attributes of a battery cell among the plurality of battery cells and provide measurements of the electrical attributes to the control circuitry. The first multiplexer may be operably coupled to each of battery cells, the measurement circuitry, and the control circuitry. The second multiplexer may be operably coupled to each of the battery cells, the current source, and the control circuitry. The control circuitry may be configured to control the first multiplexer to electrically connect the measurement circuitry to the battery cell and control the second multiplexer to electrically connect the current source to the battery cell to apply a current, output form the current source, at each of a set of frequencies to the battery cell. The control circuitry may also be configured to receive the measurements from the measurement circuitry at each of the frequencies within the set of frequencies. In this regard, the set of frequencies may include a first frequency that correlates to an electrolytic resistance of the battery cell, a second frequency that correlates to an anode impedance of the battery cell, and a third frequency that correlates to a cathode impedance of the battery cell. The control circuitry may also be configured to store the measurements for the battery cell in a memory device According to some example embodiments, an example method is also provided. The example method may include controlling, by control circuitry, a first multiplexer operably coupled to each battery cell within a plurality of battery cells to electrically connect measurement circuitry to a battery cell among a plurality of battery cells. The example method may also controlling, by the control circuitry, a second multiplexer operably coupled to each of battery cell within the plurality of battery cells to electrically connect a current source to the battery cell to apply a current, output from the current source, at each of a set of frequencies to a first selected battery cell within the plurality of battery cells. The example method may also include receiving, at the control circuitry, measurements from the measurement circuitry corresponding to each of the frequencies within the set of frequencies. In this regard, the set of frequencies may include a first frequency that correlates to an electrolytic resistance of the battery cell, a second frequency that correlates to an anode impedance of the battery cell, and a third frequency that correlates to a cathode impedance of the battery cell. The example method may further include storing the measurements for the battery cell in a memory device.

BRIEF DESCRIPTION OF THE SEVERAL VIEWS OF THE DRAWING(S)

Having thus described some embodiments in general terms, reference will now be made to the accompanying drawings, which are not necessarily drawn to scale, and wherein:

DETAILED DESCRIPTION

Figure 1:
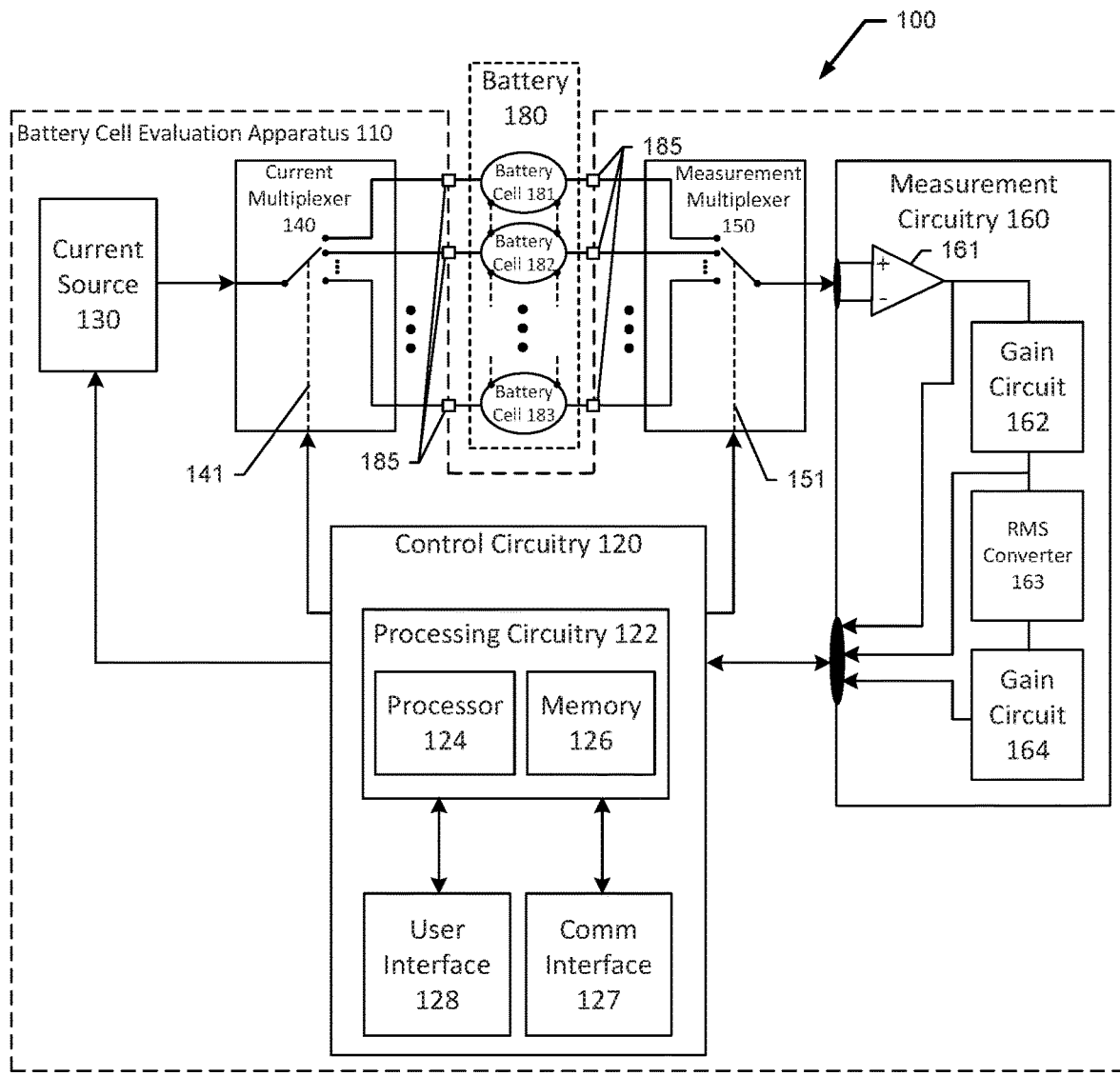
FIG. 1 illustrates a system including a battery cell evaluation apparatus for use to analyze unbundled, individual cells or multi-cell battery systems prior to installation as a power source for an electronic device according to some example embodiments.

Some example embodiments now will be described more fully hereinafter with reference to the accompanying drawings, in which some, but not all example embodiments are shown. Indeed, the examples described and pictured herein should not be construed as being limiting as to the scope, applicability or configuration of the present disclosure. Rather, these example embodiments are provided so that this disclosure will satisfy applicable legal requirements. Like reference numerals refer to like elements throughout.

According to various example embodiments, systems, apparatuses, and methods are described herein that can be used to perform battery cell evaluation on a per cell basis. For example, a battery evaluation and management system is described that can perform diagnostic and forensic analyses of battery cells, in addition to performing electrical and thermal management of the battery cells. According to some example embodiments, the evaluations performed on the battery cells can be used to determine not only the health of a battery cell, but also attributes about the battery cell that can be used for cell matching both before and after assembly of the battery cells into a battery.

To evaluate cells, according to some example embodiments, a multi-frequency impedance approach may be used. In this regard, a perturbation current (or voltage) may be applied to each of the battery cells at different frequencies (i.e., a set of frequencies) to facilitate taking measurements at each of the battery cells and at each of the frequencies. The frequencies may be predetermined, and the measurements taken at each of the frequencies may be correlated to respective attributes of a battery cell. For example, at different frequencies, impedance measurements of a battery cell may provide information about particular cell attributes such as, for example, the battery cell's electrolytic resistance, anode temperature, cathode temperature, state of health, state of charge, internal temperatures, cell voltage, or the like. In this regard, for example, the electrolytic resistance of a battery cell may be correlated to an impedance of a battery cell when the frequency of the perturbation current is between approximately 200 Hz and 1 kHz. The anode impedance and anode temperature of a battery cell may be correlated to an impedance measurement of a battery cell when the frequency of the perturbation current is approximately 70 Hz or is in a range between approximately 40 Hz and 100 Hz. Additionally, the cathode impedance and cathode temperature of a battery cell may be correlated to an impedance measurement of a battery cell when the frequency of the perturbation current is approximately 10 Hz or is in a range between approximately 5 Hz and 15 Hz. According to some example embodiments, the impedance measurements may be leveraged to determine temperature values. In this regard, the impedance measurement corresponding to the anode impedance may be used to determine the anode temperature. Similarly, the impedance measurement corresponding to the cathode impedance may be used to determine the cathode temperature. The temperatures may be derived from these impedance values based on, for example, empirical analyses that can be used to develop a relationship between the impedance values and the temperatures. For example, a lookup table may be populated and used to derive or determine a temperature (e.g., anode temperature or cathode temperature) based on a respective impedance measurement.

Based on the measurements for a given cell, a health of the battery cell may be determined on an individual basis. Additionally, according to some example embodiments, the battery cells may be considered for cell matching purposes based on the measurements for the battery cells. In this regard, based on some or all of the measurements, the battery cells may be grouped by similarity. For example, according to some example embodiments, each cell within a determined group may not have measurements that differ by more than a threshold difference in comparison to corresponding measurements of other cells in the group. According to some example embodiments, the battery cells in a group may have a cathode impedance in response to a 10 Hz perturbation current at room temperature that doesn't differ from any other cell by more than, for example, approximately 7 milliohm or a phase angle of 4 degrees. A similar threshold difference or range may be defined for each of the attributes of the battery cells that correlate to the measurements. Cells that do not fall within the group (or have attributes that differ by more than a threshold amount) may be considered "mismatched" to the battery cells that are within the group.

The threshold difference between the attributes may be defined in a number of ways. For example, according to some example embodiments, the threshold difference for one of more of the attributes may be determined relative to a standard deviation from a median value for a particular attribute (e.g., electrolytic resistance, anode impedance, anode temperature, cathode impedance, cathode temperature, or the like) in a group of battery cells. The standard deviation may be determined based on the measurement values or derivatives of measurement values for cells within a particular lot, cells manufactured over a given period of time, possibly at a particular manufacturing facility, or the like. Further, according to some example embodiments, cells that do not pass initial safety testing may be excluded from the collection of battery cells that are considered for determining a standard deviation. Additionally, according to some example embodiments, the battery cells may be considered as matched if the battery cell measurement values are sufficient to satisfy, for example, a three sigma ($3\sigma$) process for lower-quality batteries, or a six sigma ($6\sigma$) process for higher quality batteries. In this regard, the higher the sigma process the more likely it is that the outputs of the process (e.g., in this case the outputs being battery cells of a manufacturing process) are within acceptable limits or matching limits. Using a standard bell curve, a 6σ process will have 99.7% of results within acceptable or matching limits, as opposed to a 3σ process which will have 43.32% of results within acceptable or matching limits. As such, according to some example embodiments, the battery cells may be selected for matching based on a defined portion (or lesser) of a lot being within acceptable limits or matching limits.

According to some example embodiments, a battery cell evaluation may be performed on a collection of individual cells that are not yet components of a larger battery. Further, a battery cell evaluation may be performed in a manner where the battery cells are operably coupled to an apparatus for performing the battery cell evaluation but can be readily removed from operable coupling to the apparatus by a user. As such, connections between the battery cell evaluation apparatus and each of the battery cells may be made in a manner that can facilitate later disconnection via temporary contacts. Through the use of removable connections, the battery cell evaluation apparatus may be employed, for example, at a battery assembly manufacturing facility to evaluate battery cells at the various stages of the battery assembly process.

In this regard, battery cell evaluation, according to some example embodiments, may be performed on a plurality of battery cells that are not electrically connected together to form a battery (e.g., battery cells with intermittent electrical contacts). The measurements and grouping described above and otherwise herein may be leveraged for use in a battery cell screening process, for example, during manufacturing of a battery to determine which battery cells have sufficiently similar attributes to be used together in a battery that is subsequently assembled. As such, cell matching can be performed prior to battery construction to ensure that cells having similar attributes are used together in the construction of a battery, with the expectation that those cells are likely to age and degrade similarly over their lifespan, thereby maintaining a matching relationship among the battery cells. Maintaining a matching relationship among the battery cells in a battery may improve performance characteristics while reducing failure and safety risks associated with the battery.

Additionally or alternatively, a battery cell evaluation apparatus as described herein may be configured to evaluate individual cells of an assembled battery, where the battery cells are electrically connected. Similarly, the battery cell evaluation apparatus may be readily removable from the battery cells of the assembled battery to facilitate use of the battery cell evaluation apparatus within a manufacturing environment. In this regard, it is not uncommon that the process of assembling a battery from a collection of loose cells by, for example, making welded connections between the battery cells, can cause attributes of the battery cells to change. In this regard, it is not uncommon for battery cells to be damaged internally during welding. As such, evaluation of the battery cells subsequent to assembly into a battery can also be beneficial to ensure that an acceptable level of battery cell matching is still present among the battery cells of the assembled battery.

Additionally, according to some example embodiments, a battery cell evaluation apparatus, as described herein, may also be connected to a battery that is already installed as a power source to an electronic device (e.g., an electric vehicle, a power tool, a computer, a building or facility that requires a battery backup power supply to, for example, support an uninterrupted power supply, or the like). In this regard, the battery cell evaluation apparatus may be configured to evaluate the battery cells, for example, prior to permitting operation of the battery as a power source to ensure that sufficient matching among the battery cells continues to exist and the battery may be operated safely. In this regard, prior to operation of an electronic device powered by a multi-cell battery, a battery cell evaluation apparatus may be configured to apply a multi-frequency perturbation current and perform associated per-frequency, per-cell measurements to perform cell grouping or matching. If the battery cells are matched based on the measurements, then operation of the electronic device with the battery as a power source may be permitted by the battery cell evaluation apparatus. If, however, the battery cells of the battery are determined to be mismatched, for example, beyond a threshold value, then operation of the electronic device with the battery as a power source may be prevented or an alert may be provided to a user indicating the mismatched condition of the battery cells.

As such, the battery cell evaluation apparatus may be leveraged to perform per-cell diagnostic analyses that facilitate diagnosing and grouping battery cells into matching sets. In this regard, screening and matching cells may be performed prior to assembling a battery with the grouped cells, and detection of mismatched cells may also be performed after a battery has been assembled and potentially installed within an electronic device.

Additionally, the battery cell evaluation apparatus, according to some example embodiments, may be useful for forensic purposes. For example, after a battery failure event has occurred during operation of a battery as a power source for an electronic device (an electric vehicle, a power tool, a computer, a building or facility that requires a battery backup power supply to, for example, support an uninterrupted power supply, or the like), a battery cell evaluation apparatus may apply a multi-frequency perturbation current and perform measurements on a per-frequency, per-cell basis to determine which battery cell (or battery cells) has become mismatched due to, for example, damage to the battery cell (or battery cells) (e.g., from overheating or the like), and likely caused or was part of the cause of the failure. Such information may prove useful during an investigation into a battery failure event to determine root causes and possible remedial measures that may be taken to prevent additional failures.

In view of the forgoing, FIG. 1 illustrates a system 100 configured to perform cell evaluation to assess attributes of battery cells according to some example embodiments. Specifically, FIG. 1 illustrates a system 100 including a battery cell evaluation apparatus for use to analyze unbundled, individual cells or multi-cell battery systems prior to installation as a power source for an electronic device according to some example embodiments. The system 100 may include a battery cell evaluation apparatus 110 and a battery 180 having a plurality of battery cells 181, 182, and 183. The battery cell evaluation apparatus 110 may be configured to operate as a multi-frequency, impedance-based battery cell evaluation system and a battery management system (BMS). The battery cells 181, 182, and 183 may be electrochemical cells with external connectors or terminals that facilitate connecting the battery cells 181, 182, and 183 to the battery cell evaluation apparatus 110. The battery cells 181, 182, and 183 may be formed using a variety of different chemistries, including lithium-ion or lithium-polymer.

In the configuration shown in FIG. 1, the battery cell evaluation apparatus 110 may be configured to be removable from operable connection to the battery cells 181, 182, and 183. While the battery cell evaluation apparatus 110 in FIG. 1 is shown as being operably coupled to the battery cells 181, 182, and 183, the connection points 185 of the battery cell evaluation apparatus 110 may be embodied as quick-release pressure contacts or other removable connectors that interface with the terminals of the battery cells 181, 182, and 183. Such removable connectors may facilitate rapid disconnection of the battery cells 181, 182, and 183 after an evaluation of the battery cells is complete, and subsequent connection to new battery cells for a next evaluation process in, for example, a manufacturing environment.

Further, the battery cells 181, 182, and 183 may be loose or unconnected battery cells that have not yet been selected for assembly into a battery. As such, the battery cell evaluation apparatus 110 may be configured to perform evaluations of unconnected, individual battery cells. Alternatively, the battery cells 181, 182, and 183 may be connected to each other (as indicated by the dotted lines in FIG. 1 between the battery cells 181, 182, and 183) within the battery 180. Such electrical connections may be formed in a variety of ways, including welds. The battery 180 may be a multi-cell battery where the battery cells may be connected in series, parallel, or combinations thereof. The battery 180 may be constructed for subsequent installation into an electronic device to operate as a power source for the electronic device.

Accordingly, the battery cell evaluation apparatus 110 may also be configured to evaluate individual battery cells that are connected to other battery cells within a battery. According to some example embodiments, the multi-cell battery 180 can be, for example, a 16 cell battery, where the 16 battery cells are connected in series. However, the configuration of the battery cell evaluation apparatus 110 may be leveraged to evaluate batteries having any number of battery cells connected in any configuration. According to some example embodiments, the battery cell evaluation apparatus 110 may have a relatively small footprint (e.g., 4-inch×4-inch), and utilize relatively low-power (e.g., 750 mA DC at 6 V). Further, as indicted above, the battery cell evaluation apparatus 110 can act as a "standalone" unit with no need for external support or components to operate, such as an external processor, memory, or computer.

According to some example embodiments, the battery cell evaluation apparatus 110 may comprise control circuitry 120, a current source 130, a current multiplexer 140, a measurement multiplexer 150, and measurement circuitry 160. The control circuitry 120 may be configured to control and communicate with, via signals, the current source 130, the current multiplexer 140, the measurement multiplexer 150, and the measurement circuitry 160.

In general, the control circuitry 120 may be a single integrated circuit comprising processing circuitry 122 with one or more processors 124 (or processor cores) and memory 126. The control circuitry 120 may also include programmable input/output peripherals, such as a user interface 128 and a communications interface 127.

As a component of the control circuitry 120, the processing circuitry 122 may be in operative communication with the current source 130, the current multiplexer 140, the measurement multiplexer 150, and the measurement circuitry 160. The processing circuitry 122, in some example embodiments, may be in communication with the communications interface 127 and the user interface 128. The processing circuitry 122 may interact with or embody the memory 126 and the processor 124. The processing circuitry 122 may be configurable to perform various operations as described herein. In this regard, the processing circuitry 122 may be configured to perform computational processing and memory management according to some example embodiments to facilitate performing various functionalities of the control circuitry 120 and processing circuitry 122 described herein. In some embodiments, the processing circuitry 122 may be embodied as a chip or chip set. In other words, the processing circuitry 122 may comprise one or more physical packages (e.g., chips) including materials, components or wires on a structural assembly (e.g., a baseboard). According to some example embodiments, the processing circuitry 122 may be a computing cluster that includes a number of processors configured to operate in parallel to more rapidly complete tasks. The processing circuitry 122 may be embodied as a circuit chip (e.g., an integrated circuit chip, such as a field programmable gate array (FPGA)) configured (e.g., with hardware, software or a combination of hardware and software) to perform operations described herein. The processing circuitry 122 may be configured to receive inputs, for example, from the communications interface 127, the user interface 128, or the measurement circuitry 160 and perform actions based on the inputs, and generate outputs. Further, in some example embodiments, the processing circuitry 122 may be a configuration of components including some analog components. In this regard, for example, in-band measurements may be made using an analog band-pass filters in operation with an integrator (e.g., a leaky integrator). Further, operational amplifiers and other passive components, such as resistors and capacitors, may also be included to support the operation and functionalities performed by the processing circuitry 122 as described herein. As such, the processing circuitry 122 may be configured to perform signal conditioning and processing using either analog or digital techniques.

In some example embodiments, the memory 126 may include one or more non-transitory memory devices such as, for example, volatile or non-volatile memory that may be either fixed or removable. The memory 126 may be configured to store information, data, applications, instructions or the like for enabling, for example, execution of procedures and the like to carry out various functions in accordance with example embodiments. For example, the memory 126 could be configured to buffer input data for processing by the processing circuitry 122. Additionally or alternatively, the memory 126 could be configured to store instructions for execution by the processing circuitry 122. Among the contents of the memory, applications may be stored for execution by the processing circuitry 122 in order to carry out the functionality associated with each respective application.

According to some example embodiments, the processing circuitry 122 may be configured to execute instructions stored in the memory 126 or otherwise accessible to the processing circuitry 122. As such, whether configured by hardware or by a combination of hardware and software, the processing circuitry 122 may represent an entity (e.g., physically embodied in circuitry—in the form of processing circuitry 122) capable of performing operations according to example embodiments while configured accordingly. Thus, for example, when the processing circuitry 122 is embodied as an ASIC, FPGA, or the like, the processing circuitry 122 may be specifically configured hardware for conducting the operations described herein. Alternatively, as another example, when the processing circuitry 122 is embodied as an executor of software instructions, the instructions may specifically configure the processing circuitry 122 to perform the operations described herein.

The communications interface 127 may include one or more interface mechanisms for enabling communication with other devices external to cell evaluation apparatus 110, via, for example, a network, such as a local area network. In some cases, the communication interface 127 may be any means such as a device or circuitry embodied in either hardware, or a combination of hardware and software that is configured to receive or transmit data from/to devices in communication with the control circuitry 120. The communications interface 127 may be a wired or wireless interface and may support various communications protocols. Communications interface 127 may be operably coupled to an antenna to support wireless communications to other components. In this regard, the communications interface 127 and the antenna may support communications via, for example, Bluetooth or WIFI connections. According to some example embodiments, the communications interface 127 may include components and configurations to support communications via universal serial bus (USB) connection. The communications interface 127 may be configured to provide a communication mechanism for external systems (such as a laptop) to the control circuitry 120, for example, to enable viewing of the measurement information and/or programming of the control circuitry 120.

The user interface 128 may be controlled by the control circuitry 120 and the processing circuitry 122 to interact with a user. In this regard, via the user interface 128, the processing circuitry 122 may be configured to output information to a user via an output device such as, for example, driving a display (e.g., in the form of a collection of indicator lights or light emitting diodes (LEDs)) or an audio device (e.g., a speaker) and receive information input from a user via an input device such as, for example, a keyboard, mouse, touch screen, or the like. According to some example embodiments, the user interface 128 may comprise status LEDs to provide status information to a user. In this regard, the status LEDs 372 can provide a visual indication of the operations of the battery cell evaluation apparatus 110, such as power on, power off, measuring, selecting cell, charging, or the like.

Additionally, the current source 130 may be an electronic circuit that delivers an electric current, such as an alternating current (AC) or a direct current (DC). In this regard, an alternating current may be provided as a perturbation current to excite the battery cells 181, 182, and 183 and to facilitate obtaining measurements across a set of frequencies for each cell as described herein. A direct current may be used, for example, for charging the battery cells 181, 182, and 183. The control circuitry 120 may be configured to control the operation of the current source 130 and the output of the current source 130. In this regard, the control circuitry 120 may control the current source 130 to output a current at different frequencies (i.e., an alternating current). In this regard, the current source 130 may be configured to output one of selected set of frequencies for use during a battery cell evaluation process. The current source 130 may be controlled by the processing circuitry 122 to output, for example, a current with a frequency between approximately 200 Hz and 1 kHz. Further, the current source 130 may also be controlled by the processing circuitry 122 to output, for example, a current with a frequency of approximately 70 Hz or in a range between approximately 40 Hz and 100 Hz. Additionally, the current source 130 may also be controlled by the processing circuitry 122 to output, for example, a current with a frequency of approximately 10 Hz or is in a range between approximately 5 Hz and 15 Hz.

The current multiplexer 140 may be a device that can be controlled by the control circuitry 120 to electrically connect the current source 130 to a selected battery cell. As such, the current multiplexer 140 may be in a configuration where a single input of the current multiplexer 140 is electrically connected to the current source 130 and each of the outputs of the current multiplexer 140 are electrically connected to a respective one of the battery cells (i.e., a demultiplexing configuration). In operation, the current multiplexer 140 may be controlled by the control circuitry 120 by providing signals on the select lines 141 of the current multiplexer 140 to cause the current multiplexer 140 to electrically connect, internal to the current multiplexer 140, the current source 130 to a selected battery cell. For example, if the current multiplexer 140 has two select lines 141, then the current source 130 can be electrically connected to four different battery cells. In this example, the control circuitry 120 may provide signals on the two select lines 141 of 0 and 0 (e.g., low voltage and low voltage) respectively to electrically connect the current source 130 to a first battery cell; 0 and 1 (e.g., low voltage and high voltage) respectively to electrically connect the current source 130 to a second battery cell; 1 and 0 (e.g., high voltage and low voltage) respectively to electrically connect the current source 130 to a third battery cell; and 1 and 1 (e.g., high voltage and high voltage) respectively to electrically connect the current source 130 to a fourth battery cell. As such, the current multiplexer 140, which may be embodied as an integrated circuit chip, may operate as a selector switch that electrically connects the current source 130 to a selected battery cell to permit the current source 130 to apply a perturbation current at one of the set of frequencies to the selected battery cell. Upon controlling the current multiplexer 140 to connect the current source 130 to a selected battery cell, the measurement multiplexer 150 and the measurement circuitry 160 may be in a configuration to begin performing measurements on the selected battery cell in coordination with the timing for when perturbation currents at different frequencies are provided by the current source 130.

As such, the current multiplexer 140 may be operably coupled to the control circuitry 120 to permit the control circuitry 120 to control the outputs of the current multiplexer 140 that may be operably coupled, respectively, to the battery cells 181, 182, and 183. In this regard, the control circuitry 120 may control select lines 141 of the current multiplexer 140 to electrically connect the current source 130 to a selected battery cell and thereby apply a current at the output of the current source 130 to the selected battery cell through the current multiplexer 140.

Similarly, the measurement multiplexer 150 may be a device that can be controlled by the control circuitry 120 to electrically connect the measurement circuitry 160 to a selected battery cell. As such, the measurement multiplexer 150 may be in a configuration where each of the inputs of the measurement multiplexer 150 are electrically connected to a respective battery cell and the single output of the measurement multiplexer 150 is electrically connected to the measurement circuitry 160 (i.e., a multiplexing configuration). The control circuitry 120 may control select lines 151 of the measurement multiplexer 150 to cause the measurement multiplexer 150 to electrically connect, internal to the measurement multiplexer 150, a selected battery cell to the measurement circuitry 160. For example, if the measurement multiplexer 150 has two select lines 151, then four different battery cells can be electrically connected to the measurement circuitry 160. In this example, the control circuitry 120 may provide signals on the two select lines 151 of 0 and 0 (e.g., low voltage and low voltage) respectively to electrically connect the measurement circuitry 160 to a first battery cell; 0 and 1 (e.g., low voltage and high voltage)

respectively to electrically connect the measurement circuitry 160 to a second battery cell; 1 and 0 (e.g., high voltage and low voltage) respectively to electrically connect the measurement circuitry 160 to a third battery cell; and 1 and 1 (e.g., high voltage and high voltage) respectively to electrically connect the measurement circuitry 160 to a fourth battery cell. As such, the measurement multiplexer 150, which may be embodied as an integrated circuit chip, may operate as a selector switch that electrically connects the measurement circuitry 160 to a selected battery cell to permit the measurement circuitry 160 to perform measurements on the selected battery cell. Upon controlling the measurement multiplexer 150 to connect the to a selected battery cell, the measurement multiplexer 150 and the measurement circuitry 160 may be in a configuration to begin performing measurements on the selected battery cell in coordination with the timing for when perturbation currents provided by the current source 130 according to a set of frequencies are provided.

As such, the measurement multiplexer 150 may be operably coupled to the control circuitry 120 to permit the control circuitry 120 to control which input of the measurement multiplexer 150, and thus which battery cell 181, 182, and 183, is electrically connected to the measurement circuitry 160 through the measurement multiplexer 150. The control circuitry 120 may control select lines 151 of the measurement multiplexer 150 to connect the measurement circuitry 160 to the selected battery cell and facilitate performing measurements of the selected battery cell. As such, the control circuitry 120 may control the operation of both the current multiplexer 140 and the measurement multiplexer 150 in a coordinated manner such that the current source 130 and the measurement circuitry 160 are connected to the same selected battery cell at the same time to apply a perturbation current at a given frequency from the current source 130 to that battery cell and also perform measurements on that battery cell by the measurement circuitry 160.

The measurement circuitry 160 can include a set of measuring instruments or components, such as gain circuits, root means squared (RMS) converters, or the like, which may be configured to take measurements of a selected battery cell within the plurality of battery cells. For example, the measurement circuitry 160 may comprise a buffer 161, a gain circuit 162, an RMS converter 163, and a gain circuit 164. The gain circuits 162 and 164 may be configured to increase the amplitude of a signal received from the measurement multiplexer 150 via the buffer 161. The RMS converter 163 may be configured to convert the signal received from the measurement multiplexer 150, in the form of an alternating current signal, into a corresponding direct current signal for provision to the control circuitry 120. The buffer 161 (also referred to as a buffer amplifier) may be configured to provide an electrical impedance transformation from the selected battery cell to the control circuitry 120, the gain circuits 162, 164, and the RMS converter 163.

The measurement circuitry 160 may be configured to measure, for example, both amplitude and phase shift of the impedance of a selected battery cell. Further, according to some example embodiments, cell voltage measurements may also be taken by the measurement circuitry 160. According to some example embodiments, the measurements may be taken at certain times when a perturbation current for each frequency within a set of frequencies is provided to the battery cell being measured. Due to correlations with the frequencies, the measurements obtained by the measurement circuitry 160 can be used to characterize various attributes for each individual cell including respective states of the anode, the cathode, and the electrolyte. According to some example embodiments, the anode impedance, the anode temperature, the cathode impedance, the cathode temperature, and the electrolytic resistance may be determined based on the measurements (e.g., impedance measurements) taken by the measurement circuitry 160. While the measurement circuitry 160 is shown as being a separate component from the control circuitry 120, according to some example embodiments, the measurement circuitry 160 may, at least in part, be embodied within the control circuitry 120 and the control circuitry 120 may be configured to perform the operations of the measurement circuitry 160 as described herein.

According to some example embodiments, the control circuitry 120 may be configured to determine or derive the cathode temperature and the anode temperature from impedance measurements. In this regard, the impedance measurement with a perturbation current applied to the cell at approximately 70 Hz or is in a range between approximately 40 Hz and 100 Hz may be used to derive the anode temperature. Similarly, cathode temperature may be derived from the impedance measurement of a battery cell with a perturbation current applied at approximately 10 Hz or is in a range between approximately 5 Hz and 15 Hz. As mentioned above, a relational data structure (e.g., a lookup table) constructed, for example, based on empirical studies and analyses, may be queried by the control circuitry 120 to determine, for example, an anode temperature corresponding to the impedance measurement taken with a perturbation current applied to the cell at approximately 70 Hz or is in a range between approximately 40 Hz and 100 Hz. Further, a relational data structure (e.g., a lookup table) constructed, for example, based on empirical studies and analyses, may be similarly queried by the control circuitry 120 to determine, for example, a cathode temperature corresponding to the impedance measurement taken with a perturbation current applied to the cell at approximately 10 Hz or is in a range between approximately 5 Hz and 15 Hz. The derived anode and cathode temperatures may be leveraged as an attribute of a battery cell, for example, for the purpose of grouping matched cells.

Further, by controlling the number of attributes that are measured, the timing for performing an evaluation of a battery cell can be controlled. For example, the time to take measurements corresponding to cell voltage and electrolytic resistance may be a fraction of a second. Further, if anode impedance or temperature is included, the measurement time may about two seconds. If cathode impedance or temperature is included, then the measurement time may be up to approximately twelve seconds.

Having described some of the various components of the system 100, the coordinated functionality and interactions between the components can now be described. In this regard, the control circuitry 120 may be configured to control the various components to implement multi-frequency, impedance-based battery cell evaluation as described herein. In this regard, the battery cell evaluation apparatus 110 may be configured to measure amplitude and phase (real and imaginary components) of the impedance in a frequency range (e.g., up to 1000 Hz) simultaneously, and also measure DC voltages of the battery cells 181, 182, and 183.

For each cell, the battery cell evaluation apparatus 110 may be configured to utilize the measurement circuitry 160 to measure various attributes for each cell, including, the battery cell's internal temperature, internal impedance, cell voltage, state of charge (SOC), and state of health (SOH), while the battery is at rest or when the battery is under charge/discharge. Further, the measurable attributes may include cell voltage (Ecv), anode temperature (Ta), cathode temperature (Tc), electrolytic resistance (Rs), SOH, and SOC. Ta, Tc, Rs, SOH and SOC may be measured using the impedance of the selected battery cell as measured by the measurement circuitry 160. For monitoring Ecv, a DC voltmeter (not shown) may be included and utilized that has an input impedance of, for example, 2 MQ. Ecv, Ta, Tc, Rs and SOH may be measured and monitored while a multi-cell battery 180 is under charge, discharge or when it is at rest. The SOC may, according to some example embodiments, be monitored when the multi-cell battery 180 is at rest. To monitor SOC when the multi-cell battery 180 is under charge or discharge, the battery cell evaluation apparatus 110 can be augmented with a DC current meter or a coulometer. Further, the battery cell evaluation apparatus 110 may also include built-in circuits to prevent short-circuiting the wirings in any cell and/or the multi-cell battery 180.

According to some example embodiments, the control circuitry 120 may be configured to make determinations based on the measurements, such as, for example, if a battery cell internal temperature or cell voltage is too high for a battery cell under evaluation. Based on this assessment, then the control circuitry 120 may control the current source 130 such that the battery cell under evaluation does not receive any current. The control circuitry 120 may also prevent further charging of the battery cell or the battery that includes the battery cell under evaluation.

With respect to the operation of the control circuitry 120, the following functionalities may be performed as part of a battery cell evaluation. In this regard, the control circuitry 120 may be configured to select a first battery cell within the plurality of battery cells 181, 182, and 183 to be the target of an evaluation. The control circuitry 120 may also be configured to control the measurement multiplexer 150 (also referred to as the first multiplexer) to electrically connect the measurement circuitry 160 to a first selected battery cell within the plurality of battery cells 181, 182, and 183.

Additionally, the control circuitry 120 may be configured to control the current multiplexer 140 (also referred to as the second multiplexer) to electrically connect the current source 130 to the first selected battery and thus apply a current output by the current source 130 at each of a set of frequencies to the first selected battery cell. In this regard, the control circuitry 120 may be configured to control the current source 130 to generate a current at each of a set of frequencies to be provided as the input to the current multiplexer 140. According to some example embodiments, the set of frequencies may be provided sequentially while the current multiplexer 140 is providing an electrical connection between the current source 130 and the first selected battery cell. According to some example embodiments, a first frequency in the set of frequencies may be applied to each of the battery cells for measurement before the control circuitry 120 adjusts the current source 130 to provide a second frequency from the set.

According to some example embodiments, the control circuitry 120 may be further configured to receive measurements from the measurement circuitry 160 corresponding to each of the frequencies within the set of frequencies. According to some example embodiments, the set of frequencies may include a first frequency that correlates to an electrolytic resistance of the first selected battery cell, a second frequency that correlates to an anode impedance or temperature of the first selected battery cell, and a third frequency that correlates to a cathode impedance or temperature of the first selected battery cell. As described above, the first frequency may be in a range between approximately 200 Hz and 1 kHz, the second frequency may be in a range between approximately 40 Hz and 100 Hz, and the third frequency may be in a range between approximately 5 Hz and 15 Hz. The control circuitry 120 may also be configured to store the measurements for the battery cells in a memory device (e.g., memory 126). According to some Further, in an example scenario with the three battery cells 181, 182, and 183, the control circuitry 120 may select battery cell 181 as the first selected battery cell for evaluation. Accordingly, the control circuitry 120 may provide signals to select lines 151 of the measurement multiplexer 150 to cause the measurement multiplexer 150 to electrically connect battery cell 181 to the measurement circuitry 160 through the measurement multiplexer 150. The control circuitry 120 may also provide signals to select lines 141 of the current multiplexer 140 to cause the current multiplexer 140 to electrically connect battery cell 181 to the current source 130 through the current multiplexer 140. With the electrical connections in place through the multiplexers 140 and 150, the control circuitry 120 may control the current source 130 to provide a first perturbation current at a first frequency and the control circuitry 120 may control the measurement circuitry 160 to perform a first measurement of the battery cell 181 with the first perturbation current applied. The measurement circuitry 160 may provide the measurement to the control circuitry 120 for storage and analysis. The control circuitry 120 may then control the current source 130 to provide a second perturbation current at a second frequency and the control circuitry 120 may control the measurement circuitry 160 to perform a second measurement of the battery cell 181 with the second perturbation current applied. The measurement circuitry 160 may provide the second measurement to the control circuitry 120 for storage and analysis. The control circuitry 120 may then control the current source 130 to provide a third perturbation current at a third frequency and the control circuitry 120 may control the measurement circuitry 160 to perform a third measurement of the battery cell 181 with the third perturbation current applied. The measurement circuitry 160 may provide the third measurement to the control circuitry 120 for storage and analysis. This process may continue in this manner until measurements have been performed on battery cell 181 for currents at all frequencies in the frequency set.

Subsequently, the control circuitry 120 may select battery cell 182 as the second selected battery cell for evaluation. Accordingly, the control circuitry 120 may provide signals to select lines 151 of the measurement multiplexer 150 to cause the measurement multiplexer 150 to electrically connect battery cell 182 to the measurement circuitry 160 through the measurement multiplexer 150. The control circuitry 120 may also provide signals to select lines 141 of the current multiplexer 140 to cause the current multiplexer 140 to electrically connect battery cell 182 to the current source 130 through the current multiplexer 140. With the electrical connections in place through the multiplexers 140 and 150, the control circuitry 120 may control the current source 130 to provide a first perturbation current at a first frequency and the control circuitry 120 may control the measurement circuitry 160 to perform a first measurement of the battery cell 182 with the first perturbation current applied. Similar to the above, the control circuitry 120 may control the current source 130 to provide perturbation currents at each of the frequencies in the set of frequencies and perform respective measurements of the battery cell 182 for storage and analysis. Subsequently, the battery cell 183 may be selected and a similar process may be performed for the battery cell 183.

The example scenario above involves applying a perturbation current at each of the frequencies while the multiplexers 140 and 150 maintain electrical connections to the same battery cell. In an alternative approach, the current source 130 may be controlled to provide and maintain a perturbation current at a first frequency while the control circuitry 120 cycles through electrical connections to each of the battery cells, by controlling the multiplexers 140 and 150, to obtain measurements for each battery cell with the perturbation current at the first frequency. The current source 130 may be then be controlled to provide and maintain a perturbation current at a second frequency while the control circuitry 120 cycles through electrical connections to each of the battery cells, by controlling the multiplexers 140 and 150, to obtain measurements for each battery cell with the perturbation current at the second frequency. Such a process may continue until measurements are taken of all battery cells at perturbation currents at all the frequencies in the frequency set. As such, according to some example embodiments, a one frequency at a time approach may be used as an alternative to a one cell at a time approach.

Based on the stored measurements for each of the battery cells 181, 182, and 183, the control circuitry 120 may be configured to determine one or more groupings of battery cells that have measurements (and thus, attributes) that match within a threshold difference for each of the frequencies applied to the battery cells within the set of frequencies. In other words, for each measurement performed for a battery cell, a comparison may be performed against the corresponding measurements for the other cells to determine which battery cells have measurement values that are within a threshold difference of each other. Battery cells that have measurements within a threshold difference of each other may be considered "matched" and may be candidates for inclusion together in a battery to be assembled. In contrast, cells that have measurements that are not within a threshold difference of each other may be considered "mismatched" and should not be considered for inclusion together in a battery.

Figure 2:
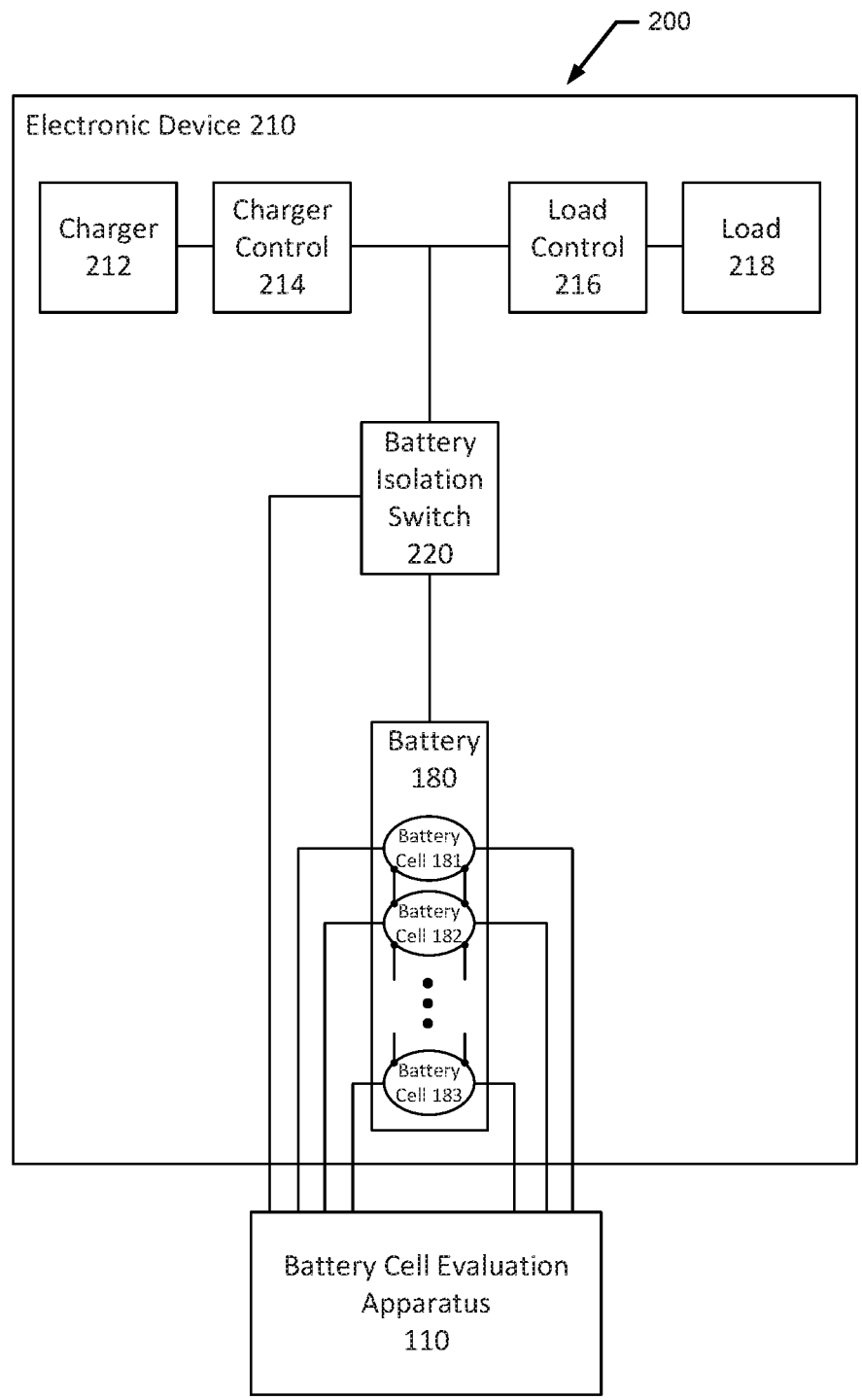
FIG. 2 illustrates a system including a battery cell evaluation apparatus for use to analyze individual cells within a battery system that has been installed as a power source for an electronic device according to some example embodiments.

FIG. 2 provides another example system 200 that comprises a battery cell evaluation apparatus 110. However, in contrast to FIG. 1, the system 200 includes the battery 180 installed within an electronic device 210 to operate as a power source for the electronic device 210. The electronic device 210 may be any type of device that requires electricity to operate and may use the battery 180 as a source of electricity. As such, electronic device 210 may be, for example, an electric vehicle, a power tool, a computer, a building or facility that requires a battery backup power supply to, for example, support an uninterrupted power supply, or the like. As such, the electronic device 210 may at least include an electrical load, such as load 218. However, the electronic device 210 may also include, for example, a charger 212, a charger control 214, and a load control 216. According to some example embodiments, the electronic device 210 may also include a battery isolation switch 220.

The charger 212 and the charger control 214 may be components of a battery charging apparatus. The charger 212 may be a device that may be operably coupled to an external power source to facilitate delivery of power to the battery 180 to recharge the battery 180. The charger 212 may include electronics (e.g., a switching power supply) to, for example, convert alternating current into direct current for direct current battery charging. The charger control 214 may be a device that may be operably coupled to charger 212 and the battery 180 to monitor and control the battery charging process. In this regard, the charger control 214 may include electronics configured to measure the current being supplied to the battery 180 during charging and, for example, discontinue charging when the current reaches a threshold level indicating that charging is complete. The charger control 214 may therefore include an internal, controllable switch to discontinue charging.

As mentioned above, the load 218 may be any type of electrical load and the load control 216 may be a device configured to control the load 218 and the power being delivered to the load 218. In this regard, the load control 216 may include electronics configured to measure the current being supplied to the load 218 or a temperature of a component of the load 218. The load control 216 may be configured to interrupt current to the load 218 if an overcurrent or overtemperature condition arises. In this regard, the load control 216 may include an internal, controllable switch or may be configured to operate the battery isolation switch 220, if such as condition arises.

The battery isolation switch 220 may be controllable switch (e.g., relay) that is capable of interrupting current being delivered from the battery 180 to the load 218. In this regard, the battery isolation switch 220 may be controllable by a number of systems, including the cell evaluation apparatus 110 as further described below.

The battery cell evaluation apparatus 110, with the control circuitry 120, may be configured to perform multi-frequency, impedance-based battery cell evaluations of the battery cells 181, 182, 183 of the battery 180. To do so, according to some example embodiments, the battery cell evaluation apparatus 110 may be permanently affixed to the electronic device 210, but may be configured to operate as described above with respect to FIG. 1. Further, the battery cell evaluation apparatus 110 may also be configured to receive a signal representing a diagnostic request from the electronic device 210 (e.g., from the charger control 214 or the load control 216) to perform an evaluation process on each of the battery cells prior to providing operational power to the electronic device 210 or initiating a charging process. In this regard, the evaluation process may include performing an evaluation process for each of the battery cells 181, 182, and 183 and storing the measurements, for example, for each battery cell 181, 182, and 183 in a memory device (e.g., memory 126).

The control circuitry 120 may also be configured to, in response to receiving the signal representing the diagnostic request, determine, based on stored measurements for each of the battery cells 181, 182, and 183, a group of battery cells that have measurements that match within a threshold difference for each of the frequencies applied to the battery cells within the set of frequencies. Further, in response to determining that one of the plurality of battery cells is not within the group, the control circuitry 120 may be configured to prevent operational power (e.g., power from the battery 180) to be provided to the electronic device or prevent charging of the battery 180, for example, by opening a switch (e.g., battery isolation switch 220) at the output of the battery 180. Additionally or alternatively, the control circuitry 120 may be configured to output an alert (e.g., via the user interface 128) to a user in response to determining that one of the plurality of battery cells is not within the group.

Figure 3:
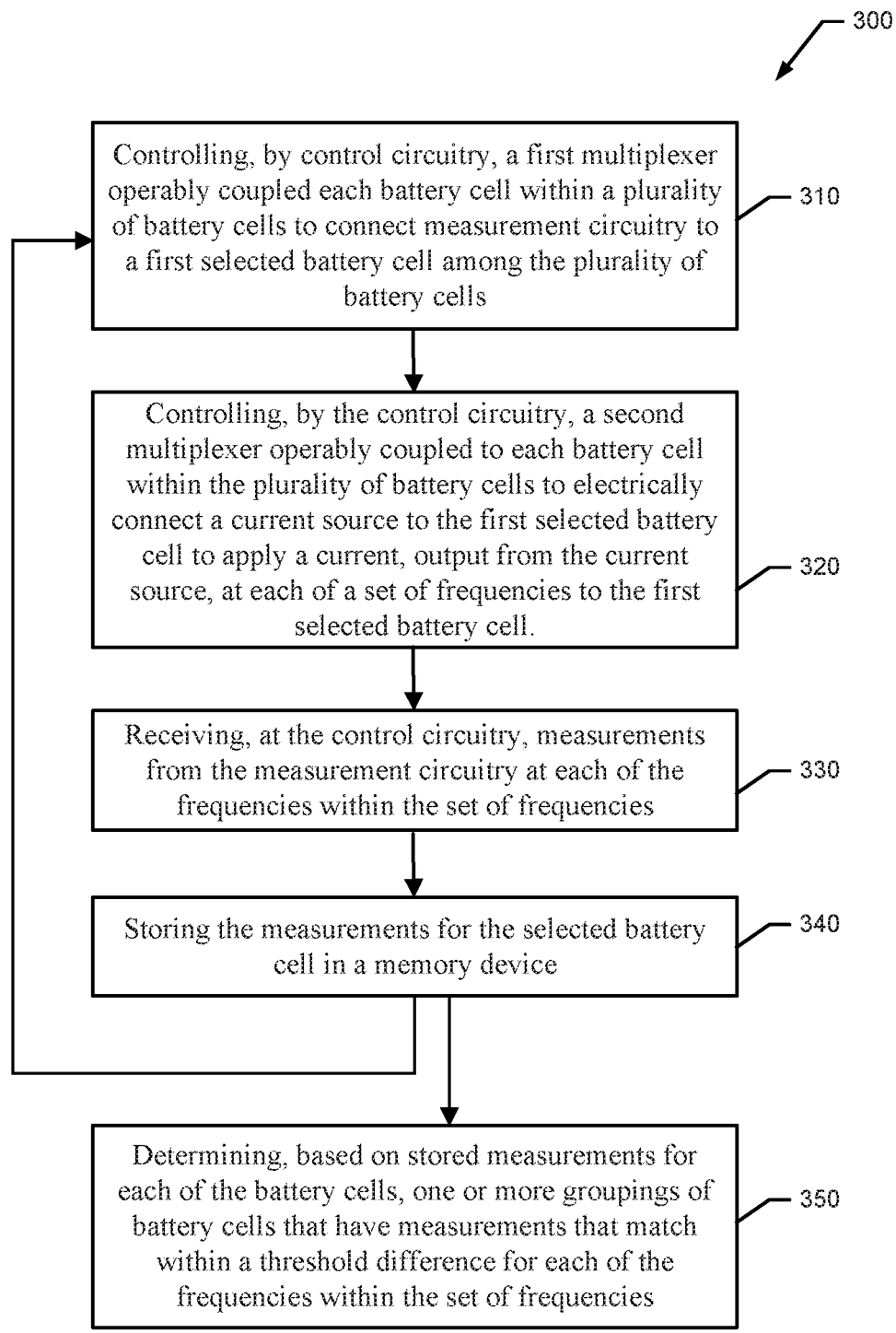
FIG. 3 illustrates a flowchart of operations for an example method for assessing attributes of battery cells according to some example embodiments.

FIG. 3 illustrates flowchart 300 of an example method for assessing attributes of battery cells according to some example embodiments. The example method may include, at 310, controlling, by control circuitry, a first multiplexer operably coupled each battery cell within a plurality of battery cells to connect measurement circuitry to a first selected battery cell among the plurality of battery cells. The example method may also include, at 320, controlling, by the control circuitry, a second multiplexer operably coupled to each battery cell within the plurality of battery cells to electrically connect a current source to the first selected battery cell to apply a current, output from the current source, at each of a set of frequencies to the first selected battery cell. At 330, the example method may include receiving, at the control circuitry, measurements from the measurement circuitry corresponding to each of the frequencies within the set of frequencies. In this regard, the set of frequencies may include a first frequency that correlates to an electrolytic resistance of the first selected battery cell, a second frequency that correlates to an anode impedance or temperature of the first selected battery cell, and a third frequency that correlates to a cathode impedance or temperature of the first selected battery cell. Further, at 340, the example method may include storing the measurements for the first selected battery cell in a memory device.

The example method may continue by repeating operations 310 to 340 for some or all of the remaining battery cells in the plurality of battery cells. Upon storing measurements for one or more of the battery cells within the plurality of battery cells, the example method may also include, at 350, determining, based on stored measurements for each of the battery cells, one or more groupings of battery cells that have measurements that match within a threshold difference for each of the frequencies within the set of frequencies.

The example method may also include various additions and modifications, some of which include the following. According to some example embodiments, the battery cells within the plurality of battery cells may not be electrically connected to each other. Alternatively, the battery cells may be connected to each other to form a battery that operates as a power source to an electronic device, and the example method may further include receiving a signal representing a diagnostic request to perform an evaluation process on each of the battery cells prior to providing operational power to the electronic device. In this regard, the evaluation process may include storing the measurements for a selected battery cell in the memory device as provided at 340. Further, the example method may include, in response to receiving the signal representing the diagnostic request, determining, based on stored measurements for each of the battery cells, a group of battery cells that have measurements that match within a threshold difference for each of the frequencies within the set of frequencies, and, in response to determining that one of the plurality of battery cells is not within the group, preventing operational power to be provided to the electronic device or outputting an alert. Additionally or alternatively, the battery cells may be electrically connected to each other to form a battery for subsequent installation into an electronic device to operate as a power source for the electronic device. Additionally or alternatively, the measurements provided by measurement circuitry may include a battery cell impedance at each of the frequencies within the set of frequencies.

Some of the operations indicated in the flowchart 300 (e.g., performing coherent detection and providing an error signal) may be implemented by various means, such as hardware, firmware, processor, circuitry and/or other device associated with execution of software including one or more computer program instructions. For example, one or more of the procedures described above may be embodied by computer program instructions. In this regard, the computer program instructions which embody the procedures described above may be stored by a memory device executed by a processor of processing circuitry. As will be appreciated, any such computer program instructions may be loaded onto a computer or other programmable apparatus (e.g., hardware) to produce a machine, such that the instructions which execute on the computer or other programmable apparatus create means for implementing the functions specified in the flowchart block(s). These computer program instructions may also be stored in a computer-readable memory that may direct a computer or other programmable apparatus to function in a particular manner, such that the instructions stored in the computer-readable memory produce an article of manufacture which implements the functions specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions and combinations of operations for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing description and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. In cases where advantages, benefits or solutions to problems are described herein, it should be appreciated that such advantages, benefits and/or solutions may be applicable to some example embodiments, but not necessarily all example embodiments. Thus, any advantages, benefits or solutions described herein should not be thought of as being critical, required or essential to all embodiments or to that which is claimed herein. Although specific terms are employed herein, they are used in a generic and descriptive sense only and not for purposes of limitation.

That which is claimed:

1. A battery cell diagnostic apparatus comprising:
control circuitry;

a current source;
measurement circuitry configured to measure electrical attributes of a battery cell among a plurality of battery cells and provide measurements of the electrical attributes to the control circuitry;
a first multiplexer operably coupled to the measurement circuitry and the control circuitry, the first multiplexer being configured to be removably coupled to each of the battery cells within the plurality of battery cells; and
a second multiplexer operably coupled to the current source and the control circuitry, the second multiplexer being configured to be removably coupled to each of the battery cells within the plurality of battery cells;
wherein the control circuitry is configured to:
control the first multiplexer to electrically connect the measurement circuitry to the battery cell among the plurality of battery cells;
control the second multiplexer to electrically connect the current source to the battery cell to apply a current, output from the current source, at each of a set of frequencies to the battery cell;
receive the measurements for the battery cell from the measurement circuitry corresponding to each of the frequencies within the set of frequencies, the set of frequencies including a first frequency that correlates to an electrolytic resistance of the battery cell, a second frequency that correlates to an anode impedance of the battery cell, and a third frequency that correlates to a cathode impedance of the battery cell, the measurements for the battery cell comprising a first measurement at the first frequency, a second measurement at the second frequency, and a third measurement at the third frequency; and
store the first measurement, the second measurement, and the third measurement in association with the battery cell in a memory device as cell attributes for the battery cell.

2. The battery cell diagnostic apparatus of claim 1, wherein the control circuitry is further configured to determine, based on stored measurements for each of the battery cells, one or more groupings of battery cells that have respective measurements for each of the battery cells that match within a first threshold difference for the first frequency, a second threshold difference for the second frequency, and a third threshold difference for the third frequency;
wherein, for the battery cell, the stored measurements comprise the first measurement, the second measurement, and the third measurement.

3. The battery cell diagnostic apparatus of claim 1, wherein the control circuitry is further configured to:
determine, based on stored measurements for each of the battery cells, a group of battery cells that have measurements that match within a threshold difference for each of the frequencies within the set of frequencies; and
in response to determining that one of the plurality of battery cells is not within the group, output an alert.

4. The battery cell diagnostic apparatus of claim 1, wherein the control circuitry is further configured to derive an anode temperature based on the anode impedance and derive a cathode temperature based on the cathode impedance.

5. The battery cell diagnostic apparatus of claim 2, wherein the first frequency is in a range between approximately 200 Hz and 1 kHz, the second frequency is in a range between approximately 40 Hz and 100 Hz, and the third frequency is in a range between approximately 5 Hz and 15 Hz.

6. The battery cell diagnostic apparatus of claim 1, wherein the measurements received from the measurement circuitry include amplitude measurements.

7. A system for assessing attributes of battery cells, the system comprising:
a plurality of battery cells, each battery cell having terminals; and
a battery cell diagnostic apparatus comprising:
control circuitry;
a current source;
measurement circuitry configured to measure electrical attributes of a battery cell among the plurality of battery cells and provide measurements of the electrical attributes to the control circuitry;
a first multiplexer operably coupled to each of battery cells, the measurement circuitry, and the control circuitry;
a second multiplexer operably coupled to each of the battery cells, the current source, and the control circuitry;
wherein the control circuitry is configured to:
control the first multiplexer to electrically connect the measurement circuitry to the battery cell;
control the second multiplexer to electrically connect the current source to the battery cell to apply a current, output from the current source, at each of a set of frequencies to the battery cell;
receive the measurements for the battery cell from the measurement circuitry corresponding to each of the frequencies within the set of frequencies, the set of frequencies including a first frequency that correlates to an electrolytic resistance of the battery cell, a second frequency that correlates to an anode impedance of the battery cell, and a third frequency that correlates to a cathode impedance of the battery cell, the measurements for the battery cell comprising a first measurement at the first frequency, a second measurement at the second frequency, and a third measurement at the third frequency; and
store the first measurement, the second measurement, and the third measurement in association with the battery cell in a memory device as cell attributes for the battery cell.

8. The system of claim 7, wherein the battery cells within the plurality of battery cells are not electrically connected to each other.

9. The system of claim 7, wherein the control circuitry is further configured to determine, based on stored measurements for each of the battery cells, one or more groupings of battery cells that have respective measurements for each of the battery cells that match within a first threshold difference for the first frequency, a second threshold difference for the second frequency, and a third threshold difference for the third frequency;
wherein, for the battery cell, the stored measurements comprise the first measurement, the second measurement, and the third measurement.

10. The system of claim 7, wherein the battery cells are connected to each other to form a battery that operates as a power source to an electronic device;
wherein the control circuitry is further configured to:
receive a signal representing a diagnostic request to perform an evaluation process on each of the battery cells prior to providing operational power to the electronic device, wherein the evaluation process includes storing the measurements for the battery cell in the memory device;

in response to receiving the signal, determine, based on stored measurements for each of the battery cells, a group of battery cells that have measurements that match within a threshold difference for each of the frequencies within the set of frequencies; and in response to determining that one of the plurality of battery cells is not within the group, prevent operational power to be provided to the electronic device or output an alert.

11. The system of claim 7, wherein the battery cells are electrically connected to each other to form a battery for subsequent installation into an electronic device to operate as a power source for the electronic device.

12. The system of claim 11, wherein electrical connections among the battery cells comprise welds.

13. The system of claim 7, wherein the control circuitry is further configured to derive an anode temperature based on the anode impedance and derive a cathode temperature based on the cathode impedance.

14. The system of claim 7, wherein the first frequency is in a range between approximately 200 Hz and 1 kHz, the second frequency is in a range between approximately 40 Hz and 100 Hz, and the third frequency is in a range between approximately 5 Hz and 15 Hz.

15. A method for assessing attributes of battery cells, the method comprising:
controlling, by control circuitry, a first multiplexer operably coupled to each battery cell within a plurality of battery cells to electrically connect measurement circuitry to a battery cell among the plurality of battery cells;
controlling, by the control circuitry, a second multiplexer operably coupled to each battery cell within the plurality of battery cells to electrically connect a current source to the battery cell to apply a current, output from the current source, at each of a set of frequencies to the battery cell;
receiving, at the control circuitry, measurements for the battery cell from the measurement circuitry corresponding to each of the frequencies within the set of frequencies, the set of frequencies including a first frequency that correlates to an electrolytic resistance of the battery cell, a second frequency that correlates to an anode impedance of battery cell, and a third frequency that correlates to a cathode impedance of the battery cell, the measurements for the battery cell comprising a first measurement at the first frequency, a second measurement at the second frequency, and a third measurement at the third frequency; and
storing the first measurement, the second measurement, and the third measurement in association with the battery cell in a memory device as cell attributes for the battery cell.

16. The method of claim 15, wherein the battery cells within the plurality of battery cells are not electrically connected to each other.

17. The method of claim 15, further comprising determining, based on stored measurements for each of the battery cells, one or more groupings of battery cells that have respective measurements for each of the battery cells that match within a first threshold difference for the first frequency, a second threshold difference for the second frequency, and a third threshold difference for the third frequency
wherein, for the battery cell, the stored measurement comprise the first measurement, the second measurement, and the third measurement.

18. The method of claim 15, wherein the battery cells are connected to each other to form a battery that operates as a power source to an electronic device; and
wherein the method further comprises:
receiving a signal representing a diagnostic request to perform an evaluation process on each of the battery cells prior to providing operational power to the electronic device, wherein the evaluation process includes storing the measurements for the battery cell in the memory device;
in response to receiving the signal, determining, based on stored measurements for each of the battery cells, a group of battery cells that have measurements that match within a threshold difference for each of the frequencies within the set of frequencies; and
in response to determining that one of the plurality of battery cells is not within the group, preventing operational power to be provided to the electronic device or outputting an alert.

19. The method of claim 15, wherein the battery cells are electrically connected to each other to form a battery for subsequent installation into an electronic device to operate as a power source for the electronic device.

20. The method of claim 17, wherein the measurements provided by measurement circuitry include a battery cell impedance at each of the frequencies within the set of frequencies.

* * * * *